United States Patent [19]

Wilson

[11] Patent Number: 5,034,603
[45] Date of Patent: Jul. 23, 1991

[54] INTEGRATED OPTICS WAVELENGTH STABILIZATION UNIT

[76] Inventor: Keith E. Wilson, 1104 Hugh Reid Dr., Arcadia, Calif. 91007

[21] Appl. No.: 432,517

[22] Filed: Nov. 6, 1989

[51] Int. Cl.$^5$ .............................................. H01J 5/16
[52] U.S. Cl. ................................. 250/227.27; 356/345
[58] Field of Search ............... 250/227.19, 227.27; 350/96.13, 96.14; 356/345; 455/600, 610–612

[56] References Cited

U.S. PATENT DOCUMENTS

| | | | |
|---|---|---|---|
| 4,364,633 | 12/1982 | Verber et al. | 350/96.14 |
| 4,683,448 | 7/1987 | Duchet et al. | 350/96.14 |
| 4,758,060 | 7/1988 | Jaeger et al. | 350/96.14 |
| 4,776,657 | 10/1988 | Reeder | 350/96.14 |
| 4,799,797 | 1/1989 | Huggins | 350/96.14 |
| 4,866,698 | 9/1989 | Huggins et al. | 455/600 |

OTHER PUBLICATIONS

"Superliminescent Diode (SLD) Wavelength Control in High Performance Fiber Optic Gyroscopes," by Schuma et al., SPIE, vol. 719 (1986).
"Narrow-Linewidth Fibre-External-Cavity Injection Lasers", by Liou et al, Elec. Letters, vol. 21, No. 20, (Sep. 26, 1985).
"Investigation of Superluminescence Emitted by a Gallium Arsenide Diode," by Kurbatou et al, *Soviet Physics—Semiconductors*, vol. 4, No. 11, May 1971.

Primary Examiner—David C. Nelms
Assistant Examiner—Khaled Shami

[57] ABSTRACT

An integrated-optics wavelength stabilization device for broad-bandwidth optical sources requires small-optical-path-difference interferometers to detect wavelength shifts. The phase retardation between the arms of the interferometer is modulated using small applied AC voltages.

30 Claims, 3 Drawing Sheets

INTEGRATED OPTICS WAVELENGTH STABILIZATION UNIT

BACKGROUND OF THE INVENTION

1. Field of the Invention

The invention relates to integrated-optics interferometers, and in particular to an interferometer fabricated on a single LiNbO$_3$ chip which is useful for stabilization of broad-bandwidth optical sources.

2. Description of the Related Art

Stability of the operating characteristics of an optical source is often a necessity in the design of a fiberoptic sensing system. For example, highly accurate fiberoptic rotation sensors require a light source with a stable wavelength. The scale factor of a rotation sensor, defined as the ratio of the output signal to the input rotation rate, depends on the wavelength of the source, and variations in source wavelength give rise to measurement inaccuracies. For rotation sensors used in navigation, a fractional variation in source wavelength of no greater than one part in a million may be required.

One type of light source which has found use in fiberoptic sensing systems is the broadband semiconductor light source, as typified by the the superluminescent diode (SLD). The use of of an SLD reduces noise from the coherent backscattering that takes place in the fiber with semiconductor diode lasers. A superluminescent diode has a broad enough spectral linewidth to obviate undesirable phase errors caused by coherent backscattering and the Kerr effect. The wavelength of light emitted from a laser diode varies with the operating temperature of the diode and with the current injected into the diode. The temperature of the diode must be held as constant as possible, and the injection current must also be regulated to maintain a stable output wavelength. The fractional shift in the centroid of the spectral output distribution must be of the order of 1 part in $10^6$ to satisfy the linearity and scale-factor stability requirements of high-grade fiberoptic rotation sensors.

Developments in the field of optical communications have led to the availability of high-quality, low-loss single-mode optical fibers and fiber components which have found wide-ranging applications in sensing technology. Single-mode fiber sensors are usually used in forming interferometers to take advantage of the techniques of optical interferometric sensing. Optical interferometers provide an unrivalled sensitivity in the detection of displacements down to the order of a thousandth of an Angstrom unit, which is equivalent to one billionth of the diameter of a human hair. Before the advent of optical fibers, conventional interferometers using bulk optical components such as beamsplitters and mirrors suffered from unwanted sensitivity to environmentally induced misalignments. The fabrication of interferometers from single-mode optical fibers eliminates this problem because the two light beams are guided along an optical path formed by the fibers themselves.

The commonest types for two-beam fiber interferometers are the Michelson interferometer and the Mach-Zehnder interferometer. The Michelson configuration is the simpler of the two, with the light from an optical source of wavelength X being divided in amplitude by a beamsplitter/directional coupler to give a reference beam and a signal beam which propagate down fiber stubs with reflecting ends. The reflected beams return to the beamsplitter/coupler where they are coherently recombined into an output signal which is detected by a photodetector.

Any difference between the optical path lengths of the in the fiber arms of the interferometer results in a change in the output signal, with a path difference of X/2 producing a shift of one interference fringe. The output of the photodetector as a function of path difference is proportional to $(1+\cos \phi)$, where $\phi$ is the phase difference between the two light beams caused by the difference in optical path length between the two arms of the interferometer.

The Mach-Zehnder configuration is slightly more complicated than the Michelson, requiring an additional beamsplitter/coupler. It offers two advantages over the Michelson configuration. First, optical feedback to the light source is reduced, which is important when semiconductor laser sources are employed. Second, there are two outputs from the second coupler which are 180 degrees out of phase with each other, of the form $(1+\cos \phi)$ and $(1-\cos \phi)$. The two outputs are equal only at the quadrature point, and can be conveniently used as the inputs to signal processing electronics to keep the interferometer at maximum sensitivity.

Devices for stabilization of the wavelength of the optical source which have been previously proposed have been either bulk-optic devices or fiberoptic devices. This is particularly true for stabilizing single-frequency lasers. The stabilization is accomplished by either locking the source wavelength to the absorption line of an element such as rubidium or iodine or by locking to a stabilized Fabry-Perot or Michelson interferometer. These methods, however, which are successful in stabilizing narrow-line sources with long coherence lengths, are ineffective in stabilizing broad-bandwidth sources with short coherence lengths.

Nav-grade performance of the fiberoptic gyroscope (FOG) requires that the wavelength of the optical source be stabilized. Because the preferred optical sources for FOGs are superluminescent laser diodes (SLDs), short-optical-pathlength-difference polarimetric interferometers have been used to stabilize the source wavelength. These are bulk-optic devices which necessitate strict constraints on the optical thicknesses of the two thermally compensated crystals which are the crux of the devices. In addition, the performance of these bulk-optic devices is sensitive to temperature differences between the crystals.

Because it is fabricated on a single chip, both the optical pathlength difference (opd) and the temperature gradients of an integrated-optics wavelength stabilization unit (IOWSU) can be carefully controlled. In addition, the integrated-optics technology of fabricating these devices is well developed, and these devices can be produced readily in large quantities.

SUMMARY OF THE INVENTION

An integrated-optics wavelength stabilization device in accordance with the invention comprises a substrate of an electro-optic material, a first waveguide path on the substrate having first and second ends; means for altering the index of refraction along the first waveguide path in real time; a second waveguide path on the substrate having first and second ends; means for simultaneously introducing portions of a light beam into the first ends of the first and second waveguide paths; and means for simultaneously extracting the portions of the light beam from the second ends of the first and second waveguide paths. The device may further comprise means for altering the index of refraction along the second waveguide path. The means for altering the index of refraction along the second waveguide path comprises means for applying an electrical potential difference across at least a portion of the second waveguide path.

In a preferred embodiment, the two optical pathlengths form the arms of a mismatched-pathlength Mach-Zehnder interferometer. The waveguides are fabricated in a LiNbO$_3$ substrate by titanium in-diffusion.

Thermal compensation between the two arms of a mismatched-pathlength interferometer requires that the phase retardation between light beams propagating in the two paths of the interferometer be invariant with changes in ambient temperature. This requirement necessitates that either the thermo-optic or thermal expansion coefficients in the two arms of the interferometer be different. In a monolithic substrate, such as in the integrated-optic Mach-Zehnder interferometer, both of these coefficients are the same for both optical paths. However, thermal compensation in the mismatched-pathlength Mach-Zehnder interferometer is achieved by applying a DC electric field to one of the arms of the interferometer to excite the material electro-optic coefficient along that arm. The temperature dependence of the electro-optic coefficient of the substrate in that arm, then modifies the thermo-optic coefficient in that arm of the interferometer, thereby making thermal compensation of the interferometer attainable.

BRIEF DESCRIPTION OF THE DRAWINGS

The various features and advantages of the present invention will become apparent in light of the following detailed description taken together with the accompanying drawings, in which.

DESCRIPTION OF THE PREFERRED EMBODIMENT

Figure 1:
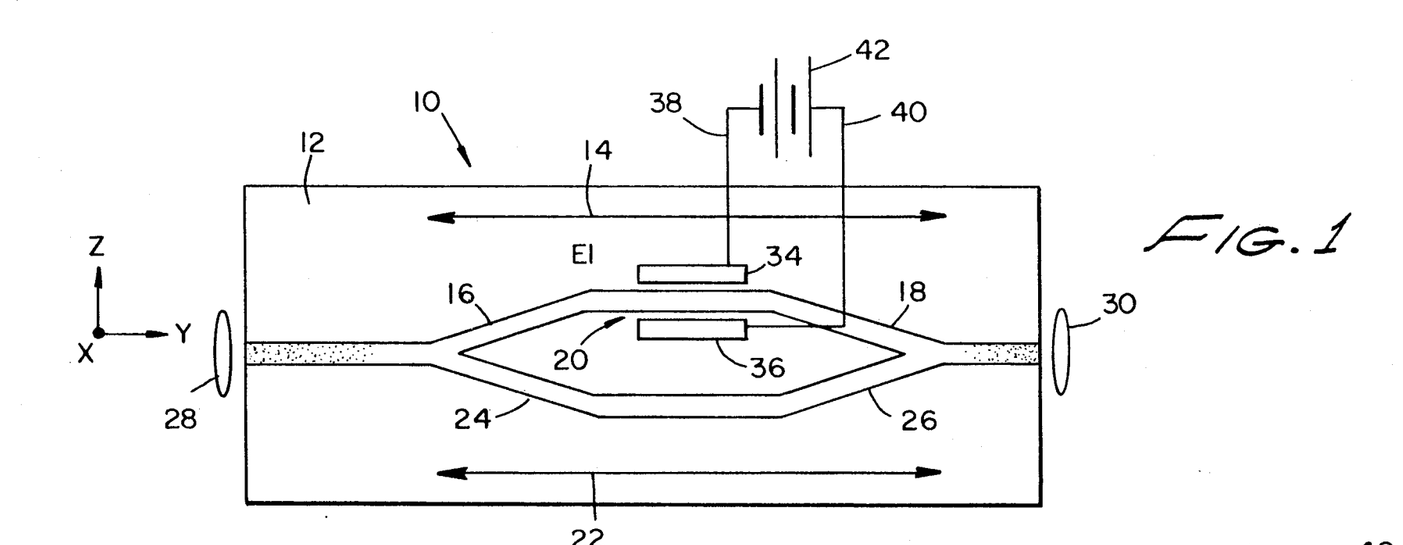
FIG. 1 is a perspective schematic view of a first embodiment of an x-cut LiNbO$_3$ integrated-optics wavelength stabilization device in accordance with the invention.
Figure 1A:
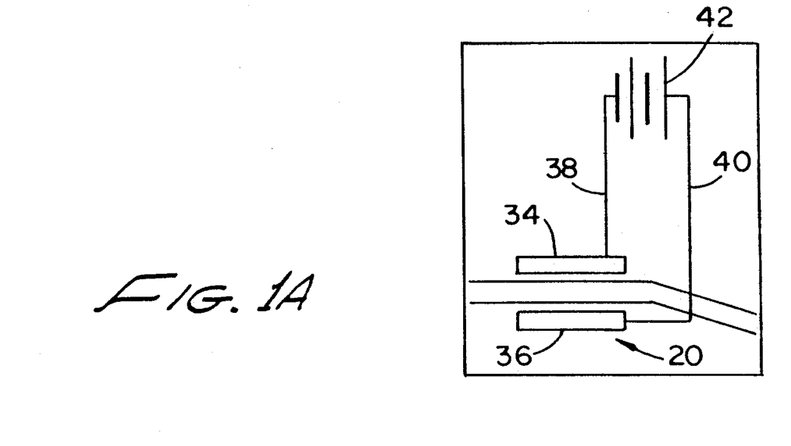
FIG. 1A is an exploded view of the electrodes and waveguide shown in FIG. 1.

Referring to FIG. 1, which is a perspective schematic view, a first embodiment of an integrated-optics wavelength stabilization device 10 in accordance with the invention is seen to comprise a substrate 12; a first waveguide path 14 on substrate 12 having a first end 16 and a second end 18; means 20 for altering the index of refraction along the first waveguide path 14 in real time; a second waveguide path 22 on substrate 12 having first and second ends 24 and 26, respectively; means 28 for simultaneously introducing portions of a light beam into the first ends 16 and 24 of the first and second waveguide paths 14 and 22, respectively; and means 30 for simultaneously extracting the portions of the light beam from the second ends 18 and 26 of the first and second waveguide paths 14 and 22, respectively. The means 20 for altering the index of refraction along the first waveguide path can comprise a means for applying an electrical potential difference across at least a portion of the particular waveguide path. For example, means 20 is shown in FIG. 1 as comprising first and second electrodes 34 and 36 on either side of a portion of first waveguide path 14. Electrical leads 38 and 40 connect electrodes 34 and 36 to a source of electromotive force 42 capable of supplying a suitable electrical potential difference across waveguide path 14 to change the index of refraction along the path by means of the electro-optic effect in the material of the substrate 12.

The most common way of producing waveguide paths in an electro-optic material is to create regions of higher refractive index than the bulk of the material. For example, in a LiNbO$_3$ substrate a vacuum-deposited layer of titanium can be diffused into the substrate in such a way that the indiffused Ti guides have a slightly higher refractive index than the surrounding LiNbO$_3$. The mechanism of guiding light is the same as in an optical fiber. The electromagnetic fields in the core of an optical fiber form a standing wave pattern in a cross section of the guide and a traveling wave along the guide. The difference between an optical fiber guide and a Ti-indiffused guide in LiNbO$_3$ is that the guiding interfaces are asymmetric, with air on one side and LiNbO$_3$ on the remaining three sides.

The processing steps for waveguide fabrication start with cleaning a LiNbO$_3$ chip and spinning a thin layer of photoresist onto the top layer. Next the chip is put into a photolithographic masking system and an image of the waveguide mask is exposed onto the photoresist. The image is then developed by removing the exposed portion of the photoresist and the chip is placed in a sputtering chamber for application of a thin layer of titanium. After removal of the chip from the sputtering chamber, acetone is used to remove the photoresist coated with titanium. What are left are titanium lines corresponding to lines on the original mask. Next the chip is introduced into a diffusion furnace and kept there for approximately five hours at 1000° C. While the chip is in the diffusion chamber the titanium lines diffuse into the LiNbO$_3$ substrate. A region having a higher refractive index than that of the substrate is formed by each line, with a width of about 3 to 9 microns and a depth of about 2 to 6 microns. Finally the two ends of the chip are polished so that light can be coupled into and out of the device. Electrodes and buffer layers are deposited on the device and wires are attached from electrical connectors to the electrodes before final packaging. Fiber pigtails may be bonded to the chip for efficient coupling of light to and from the device.

For an interferometer to perform as a reference interferometer for wavelength stabilization it is necessary that the optical path difference in the interferometer be insensitive to changes in the environmental conditions and be sensitive only to changes in the wavelength of the optical source. For a monolithic solid-state interferometer the primary source of optical path difference variations is the temperature. Therefore, for such a device it is generally sufficient to design the interferometer so that it is insensitive to temperature variations.

The phase difference between the light beam traveling along paths 14 and 22, as shown in FIG. 1, is given by $$Z = k_0\{n_1 l_1 - n_2 l_2\}, \quad (1)$$

where $k_0$ is the free-space wave number and $n_1$ and $n_2$ are the effective refractive indices of the optical modes in the two single-mode waveguides. The interferometer is designed so that the optical path difference, given by the quantity in brackets in Equation (1), is an integral number of wavelengths.

The condition for thermal insensitivity of the interferometer is determined by setting the derivative dZ/dT in Equation (1) equal to zero. That is, $$(dZ/dT) = k_0\{c_1[n_1 l_1 - n_2 l_2] + c_{n1} n_1 l_1 - c_{n2} n_2 l_2 56, \quad (2)$$

where $c_1 = (1/l)\{dl/dT\}$, where $C_1$ = coefficient of thermal expansion along y-axis $c_{n1} = (1/n_1)\{dn_1/dT\}$,
and $c_{n2} = (1/n_2)\{dn_2/dT\}$.

Although it is not mandatory, the interferometer is designed so that the optical path difference is an integral number of wavelengths, and the condition for thermal compensation becomes $$c_{n2} - c_{n1} = M \cdot L \cdot \{c_1 + c_{n1}\}/n_2 l_2 = T_{C1}, \quad (3)$$

where M is an integer, typically between 30 and 50 for SLD sources and titanium in-diffused $LiNbO_3$ waveguides, and L is the wavelength of light in the waveguide.

In general, in a Mach-Zehnder interferometer such as that shown in FIG. 1 the thermo-optic coefficients $c_{n1}$ and $c_{n2}$ are equal if no electric field is applied to either waveguide. In such an interferometer thermal compensation cannot be achieved if the optical path difference in the interferometer is nonzero. However, when an electric field is applied to one arm of the interferometer both the propagation constant and the thermo-optic constant in that arm change. The applied electric field can then be tailored to achieve temperature compensation in the mismatched-pathlength Mach-Zehnder interferometer.

When an electric field E is applied to the waveguide the change in the refractive index of the waveguide is proportional to the field strength. For an x-cut $LiNbO_3$ crystal with the electric field along the z-axis as shown, the change in the extraordinary refractive index of the TE (transverse electric) of waveguide mode is $$\delta n_e = n_e^3 r_{33} E_z/2,$$

where $r_{33}$ is the electrolytic coefficient of the material, with the applied electric field along the z-direction (4a) of the material and $E_z$ is the electric field applied along the z-axis of the material. Then, with electrodes attached to arm 2 of the interferometer the index $n_2$ is given by $$n_2 = n_1 + \delta n_e, \quad (4b)$$

where $n_1 = n_e$ and $n_e$ is the extraordinary refractive index of the substrate.

Differentiating Equation (4b) with respect to temperature and dividing by $n_2$, the condition for thermal compensation as given by Equation (3) becomes $$\begin{aligned} c_{n2} - c_{n1} &= \{d[\delta n_e]/dT - [\delta n_e]c_{n1}\}/n_e \\ &= \{\delta n_e/n_e\}\{r_{33}^{-1}(dr_{33}/dT) + 2c_{n1}\} \\ &= \{\delta n_e/n_e\}R. \end{aligned} \quad (5)$$

The temperature dependence of the electric field in Equation (5) has been neglected since this is a characteristic of the power supply rather than of the interferometer. For good electronic components this temperature dependence is typically 3 ppm/°C.

The electric field $E_z$ required for thermal compensation is determined from Equations (3), (4), and (5), and is given by $$\begin{aligned} E_z &= \frac{2(C_{n2} - C_{n1})}{R n_e^2 r_{33}} \\ &= \frac{2T_{c1}}{n_e^2 r_{33}}. \end{aligned}$$

Substituting typical values for the optical constants and assuming a 1-cm-long waveguide with M=20, the electric field required for thermal compensation is about $7.34 \times 10^5$ volts/meter for a 0.82-μm wavelength optical probe beam. For 6-μm spaced electrodes, this corresponds to a potential difference of about 4.4 volts across the electrodes.

Figure 2:
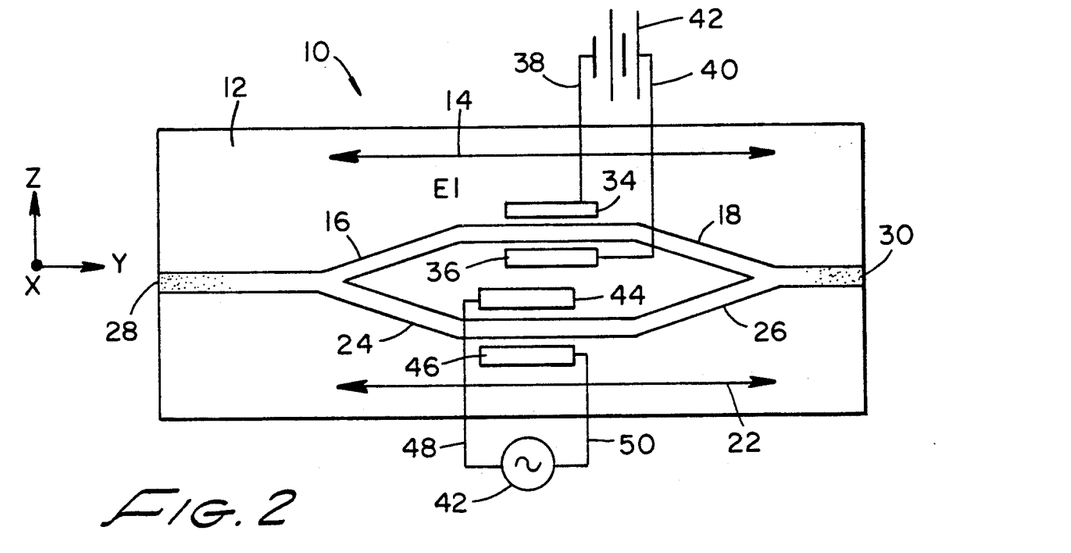
FIG. 2 is a perspective schematic view of a second embodiment of an x-cut LiNbO$_3$ integrated-optics wavelength stabilization device in accordance with the invention, and shows the position of an electrode pair for applying an AC voltage across the second arm of the interferometer.

Another advantage of the integrated-optics wavelength stabilization device 10 is that it is amenable to AC signal processing techniques, which can be utilized by applying an AC 42 voltage across the electrodes 44 and 46 of the second arm 22 of the interferometer through the wire leads 48 and 50. For electrodes spaced 6 μm apart, the scale factor is 0.48 volts per radian of phase shift.

Figure 3:
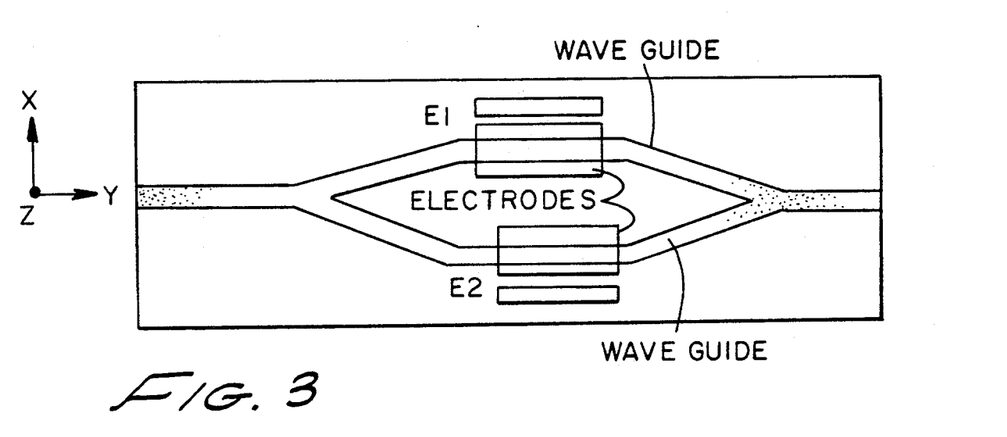
FIG. 3 is a perspective schematic view of an embodiment of a z-cut LiNbO$_3$ integrated-optics interferometer, and shows the position of the electrodes with respect to the waveguide.
Figure 3A:
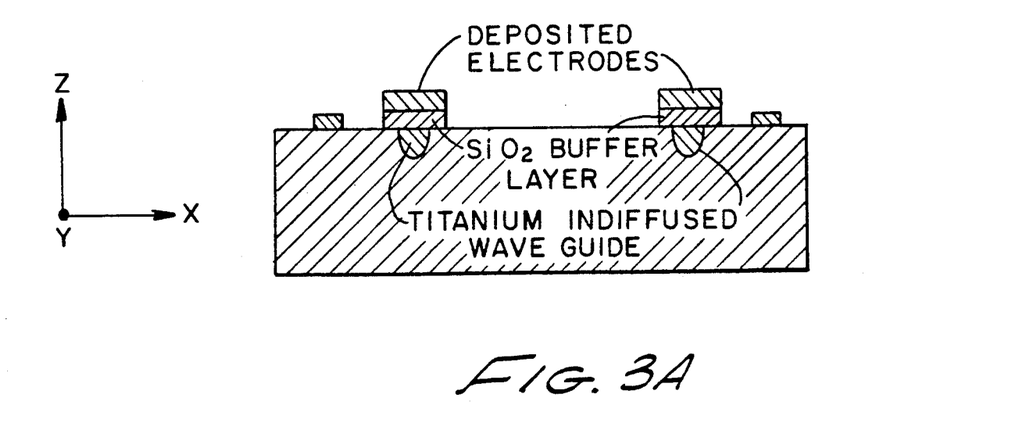
FIG. 3A is a sectional view of the electrodes and waveguides shown in FIG. 3.

Although the analysis presented here details a thermally compensated TE mode interferometer in $LiNbO_3$, this technique can also be used for TM waveguides in the same substrate. In such a device, the waveguides are fabricated on z-cut y-propagating $LiNbO_3$ chips. See FIG. 3. In this configuration electrodes are deposited above the waveguides. To ensure low propagation losses a thin $SiO_2$ buffer layer is deposited over the waveguides prior to laying down the electrodes.

The integrated-optics wavelength stabilization device 10 which has been described may be used in methods for stabilizing the wavelength of a broad-bandwidth optical source which is excited by a source of drive current. Such a method would typically comprise coupling light from the broad-bandwidth optical source simultaneously into the first ends 16 and 18 of the first and second waveguide paths 14 and 22 of device 10 so that first and second lightwaves propagate along the first and second waveguide paths 14 and 22, respectively; extracting a light signal from the second ends 24 and 26 of the first and second waveguide paths 14 and 22; processing the extracted light signal to produce an electrical signal representative of a phase difference between the first and second light waves; and feeding back a control signal produced in response to the electrical signal representative of the phase difference, to the source of drive current for the broad-bandwidth optical source.

Figure 4:
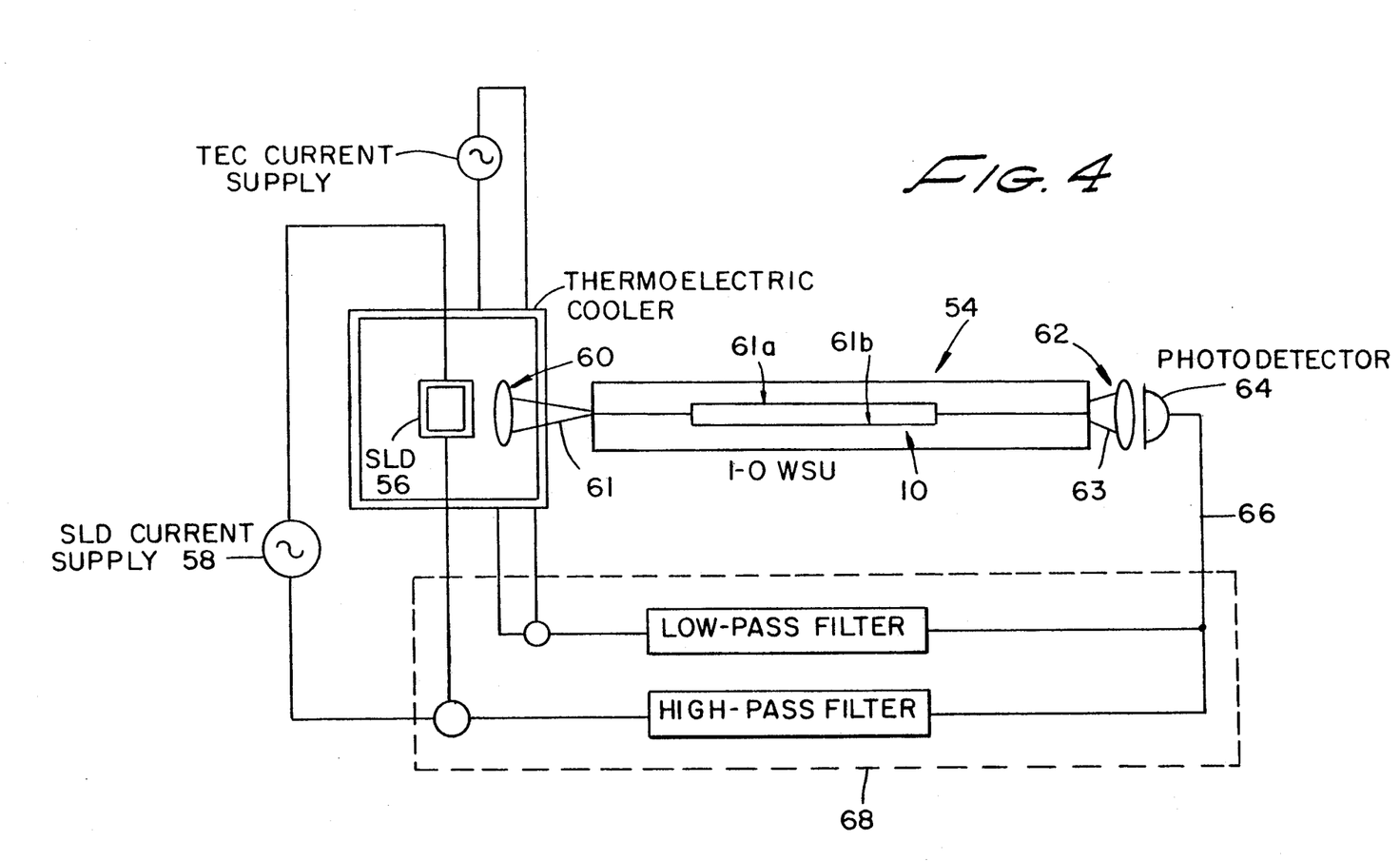
FIG. 4 is a schematic block diagram of a apparatus in accordance with the invention for stabilizing the wavelength of a broad-band optical source.

FIG. 4 shows, in block diagram form, an apparatus 54 for stabilizing the wavelength of a broad-bandwidth optical source 56 excited by a source 58 of drive current. The wavelength stabilization apparatus 54 comprises the device 10 depicted in FIGS. 1 and 2; a means 60 for coupling light 61 from the broad-bandwidth optical source 56 simultaneously into the first ends of the first and second waveguide paths of device 10 so that first and second lightwaves 61a and 61b propagate along the first and second waveguide paths 14 and 22, respectively; a means 62 for extracting a light signal 63 from the second ends of the first and second waveguide paths; a means 64 for processing the light signal 63 to produce an electrical signal 66 representative of a phase difference between the first and second light waves 61a and 61b; feedback control means 68 for controlling, in response to the electrical signal 66 representative of the phase difference, an output current from the source 58 of drive current to the broad-bandwidth optical source 56.

The above-described embodiments are furnished as illustrative of the principles of the invention, and are not intended to define the only embodiment possible in accordance with our teaching. Rather, the invention is to be considered as encompassing not only the specific embodiments shown, but also any others falling within the scope of the following claims.

What is claimed is:

1. An integrated optics device comprising:
    mismatched-pathlength waveguide means for guiding first and second lightwaves along first and second optical paths, respectively, on a chip; and
    electro-optic thermal compensation means for compensating a difference in optical path length between said first and second optical paths due to a change in temperature of said chip, operatively connected to one of said waveguide means, said electro-optic thermal compensation means comprising means for applying an electrical field, said electrical field having a strength (E) equal to $2T_{C1}n_e^2 r_{33}R$, to one of said optical paths, to compensate for the effects of temperature, and wherein said one optical path comprises a material exhibiting an electro-optic effect, and wherein $r_{33}$ is the electrolytic coefficient of the material, $n_e$ is the extraordinary refractive index of said material, $T_{C1}$ is the difference, if any, between the thermo-optic coefficient for said first and second optical paths, and R is equal to $(1/r_{33})(dr_{33}/dT)$ plus $2C_{n1}$, where T is temperature and $C_{n1}$ is the thermo-optic coefficient for the first optical path.

2. An integrated-optics interferometric device comprising:
    a substrate;
    a first waveguide path on said substrate having first and second ends;
    a second waveguide path on said substrate having first and second ends, said first waveguide path and said second waveguide path comprising a mismatched-pathlength interferometer;
    means for altering the index of refraction along said first waveguide path in real time, coupled to said first waveguide path, said altering means comprising means for applying an electrical potential difference across at least a portion of said first waveguide path, said electrical potential difference (E) equalling $2T_{C1}/n_e^2 r_{33}R$, where $n_e$ is the extraordinary refractive index of the waveguide, $r_{33}$ is the electrolytic coefficient of the waveguide, R is equal to $(1/r_{33})(dr_{33}/dT)$ plus $2C_{n1}$, where T is temperature and $C_{n1}$ is the thermo-optic coefficient for the first optical path, and $T_{C1}$ is the difference, if any, between the thermo-optic coefficient of said first and said second waveguide paths;
    means for simultaneously introducing portions of a light beam into said first ends of said first and second waveguide paths, coupled to said first ends of said first and second waveguide paths; and
    means for simultaneously extracting said portions of said light beam from said second ends of said first and second waveguide paths, coupled to said second ends of said first and second waveguide paths.

3. The device of claim 2 further comprising means for altering the index of refraction along said second waveguide path in real time, coupled to said second waveguide path.

4. The device of claim 3 wherein said means for altering the index of refraction along said second waveguide path comprises means for applying an electrical potential difference across at least a portion of said second waveguide path.

5. The device of claim 4 wherein said means for applying an electrical potential difference across at least a portion of said second waveguide path comprises first and second spaced-apart electrodes adjacent and to either side of said second waveguide path on said substrate.

6. The device of claim 4 wherein said means for applying an electrical potential difference across at least a portion of said second waveguide path comprises first and second spaced-apart electrodes above and adjacent to said second waveguide path.

7. The device of claim 4 wherein said means for applying an electrical potential difference across at least a portion of said first waveguide path comprises first and second spaced-apart electrodes adjacent and to either side of said first waveguide path on said substrate.

8. The device of claim 7 wherein said means for applying an electrical potential difference across at least a portion of said first waveguide path comprises first and second spaced-apart electrodes above and adjacent to said first waveguide path.

9. The device of claim 2 wherein said substrate comprises monocrystalline $LiNbO_3$.

10. The device of claim 9 wherein each of said first and second waveguide paths comprises titanium-indiffused $LiNbO_3$.

11. The device of claim 9 wherein said substrate is an x-cut y-propagating chip, said first waveguide path is generally linear in shape over at least a portion thereof which is substantially aligned with the y-axis of said chip, and said first and second electrodes are located on opposite sides of said generally linear portion of said first waveguide path.

12. The device of claim 9 wherein said substrate is a z-cut y-propagating chip, said first waveguide path is generally linear in shape over at least a portion thereof which is substantially aligned with the y-axis of said chip, and said first and second electrodes are located above and adjacent to said linear portion of said first waveguide path.

13. The device of claim 12 further comprising a layer of SiO$_2$ between said generally linear portion of said first waveguide path and said first electrode.

14. A method for stabilizing the wavelength of a broad-bandwidth optical source excited by a source of drive current, comprising:
  coupling light from said broad-bandwidth optical source simultaneously into first ends of first and second waveguide paths of an integrated optics device comprising means for guiding first and second lightwaves along first and second waveguide paths, respectively, on a chip; and electro-optic thermal compensation means for compensating a difference in optical pathlength between said first and second waveguide paths due to a change in temperature of said chip, optically connected to one of said waveguide means so that first and second lightwaves propagate along said first and second waveguide paths, respectively;
  extracting a light signal from said second ends of said first and second waveguide paths;
  processing said light signal to produce an electrical signal representative of a phase difference between said first and second lightwaves; and
  feeding back a control signal produced in response to said electrical signal representative of said phase difference, to said source of drive current for said broad-bandwidth optical source to stabilize the wavelength of said broad-bandwidth optical source.

15. An apparatus for stabilizing the wavelength of a broad-bandwidth optical source excited by a source of drive current, comprising:
  an integrated-optics interferometric device comprising:
  a substrate;
  a first waveguide path on said substrate having first and second ends;
  means for altering the index of refraction on said first waveguide path in real time, coupled to said first waveguide path;
  second waveguide path on said substrate having first and second ends;
  means for simultaneously coupling light from said broad-bandwidth optical source into said first ends of said first and second waveguide paths, coupled to said first ends of said first and second waveguide paths, so that first and second lightwaves propagate along said first and second waveguide paths, respectively; and
  means for simultaneously extracting a light signal from said second ends of said first and second waveguide paths, coupled to said second ends of said first and second waveguide paths;
  means for processing said light signal to produce an electrical signal representative of a phase difference between said first and second lightwaves; and
  feedback control means for controlling, in response to said electrical signal representative of said phase difference, an output current from said source of drive current to said broad-bandwidth optical source to stabilize the wavelength of said broad-bandwidth optical source.

16. The apparatus of claim 15 further comprising means for altering the index of refraction along said second waveguide path, coupled to said second waveguide path.

17. The apparatus of claim 16 wherein said means for altering the index of refraction along said second waveguide path comprises means for applying an electrical potential difference across at least a portion of said second waveguide path, coupled to said portion of said second waveguide path.

18. The apparatus of claim 17 wherein said means for applying an electrical potential difference across at least a portion of said first waveguide path comprises first and second spaced-apart electrodes adjacent and to either side of said second waveguide path on said substrate.

19. The apparatus of claim 17 wherein said means for applying an electrical potential difference across at least a portion of said second waveguide path comprises first and second spaced-apart electrodes above and adjacent to said second waveguide path.

20. The apparatus of claim 16 wherein said means for altering the index of refraction along said first waveguide path comprises means for applying an electrical potential difference across at least a portion of said first waveguide path, coupled to said portion of said first waveguide path.

21. The apparatus of claim 20 wherein said means for applying an electrical potential difference across at least a portion of said first waveguide path comprises first and second spaced-apart electrodes adjacent and to either side of said first waveguide path on said substrate.

22. The apparatus of claim 21 further comprising a modulation source means for providing a source of modulation voltage to said first and second electrodes, electrically connected to said first and second electrodes.

23. The apparatus of claim 20 wherein said means for applying an electrical potential difference across at least a portion of said first waveguide path comprises first and second spaced-apart electrodes above and adjacent to said first waveguide path.

24. The apparatus of claim 23 further comprising a modulation source means for providing a source of modulation voltage to said first and second electrodes, electrically connected to said first and second electrodes.

25. The apparatus of claim 15 wherein said substrate comprises monocrystalline LiNbO$_3$.

26. The apparatus of claim 15 wherein each of said first and second waveguide paths comprises titanium-indiffused LiNbO$_3$.

27. The apparatus of claim 15 wherein said substrate is an x-cut y-propagating chip, said first waveguide path is generally linear in shape over at least a portion thereof which is substantially aligned with the y-axis of said chip, and said first and second electrodes are located on opposite sides of said generally linear portion of said first waveguide path.

28. The apparatus of claim 15 wherein said substrate is a z-cut y-propagating chip, said first waveguide path is generally linear in shape over at least a portion thereof which is substantially aligned with the y-axis of said chip, and said first and second electrodes are located above and adjacent to said linear portion of said first waveguide path.

29. The apparatus of claim 28 further comprising a first layer of $SiO_2$ between said generally linear portion of said first waveguide path.

30. The apparatus of claim 29 wherein an electric field of strength $E_z[2n_e T_{Cl}/[r_{33}R]\ 2T_{Cl}/n_e^2 r_{33}R$ is applied between said first and second electrodes to compensate said first waveguide path for the effects of temperature, where $n_e$ is the extraordinary refractive index of the material in said first waveguide path, $r_{33}$ is the electrolytic coefficient of said material, R is equal to $(1/r_{33})(dr_{33}/dT)$ plus $2C_{n1}$, where T is temperature and $C_{n1}$ is the thermo-optic coefficient for the first optical path, and $T_{Cl}$ is the difference, if any, between the thermal-optical coefficients for the materials in said first and in said second optic waveguide paths.

* * * * *

UNITED STATES PATENT AND TRADEMARK OFFICE
CERTIFICATE OF CORRECTION

PATENT NO. : 5,034,603

DATED : July 23, 1991

INVENTOR(S) : Keith E. Wilson

It is certified that error appears in the above-identified patent and that said Letters Patent is hereby corrected as shown below:

On the title page, please insert the following:

--[73] Assignee: Litton Systems, Inc., Woodland Hills, California--.

Signed and Sealed this

Twenty-seventh Day of October, 1992

Attest:

DOUGLAS B. COMER

Attesting Officer

Acting Commissioner of Patents and Trademarks